United States Patent
Danilak (12)

(10) Patent No.: US 7,051,152 B1
(45) Date of Patent: May 23, 2006

(54) METHOD AND SYSTEM OF IMPROVING DISK ACCESS TIME BY COMPRESSION

(75) Inventor: Radoslav Danilak, Santa Clara, CA (US)

(73) Assignee: nVidia Corporation, Santa Clara, CA (US)

( * ) Notice: Subject to any disclaimer, the term of this patent is extended or adjusted under 35 U.S.C. 154(b) by 394 days.

(21) Appl. No.: 10/214,975

(22) Filed: Aug. 7, 2002

(51) Int. Cl.
*G06F 12/00* (2006.01)

(52) U.S. Cl. ............................ 711/100; 711/4; 711/111; 711/112; 711/154; 710/68

(58) Field of Classification Search ................ 711/112, 711/113, 159, 170, 154, 173
See application file for complete search history.

(56) References Cited

U.S. PATENT DOCUMENTS

| | | | |
|---|---|---|---|
| 6,115,787 A * | 9/2000 | Obara ...................... 711/113 |
| 6,360,300 B1 * | 3/2002 | Corcoran et al. ........... 711/139 |
| 6,442,659 B1 * | 8/2002 | Blumenau .................... 711/162 |
| 6,449,689 B1 * | 9/2002 | Corcoran et al. ........... 711/113 |
| 2003/0058873 A1 * | 3/2003 | Geiger et al. ............... 370/401 |

* cited by examiner

*Primary Examiner*—Gary Portka
*Assistant Examiner*—Jasmine Song
(74) *Attorney, Agent, or Firm*—Wagner, Murabito & Hao LLP

(57) ABSTRACT

A data storage system using compression to increase performance. The system has a hardware compression/decompression engine for performing data compression on a data block and performing data decompression of the data block. A controller is coupled to the hardware compression/decompression engine and is for storing compressed data of the data block in a primary region of a data storage device and is further for storing any overflow from the primary region in an overflow region of the data storage device. The overflow region is dedicated to the primary region. There may be a number of such primary regions and a number of such secondary regions, with the secondary regions mapped one-to-one to the primary regions.

37 Claims, 9 Drawing Sheets

440

| PAGE ADDRESS | DISK ADDRESS | FLAGS |
|---|---|---|
| ⋮ | ⋮ | ⋮ |

FIGURE 5

METHOD AND SYSTEM OF IMPROVING DISK ACCESS TIME BY COMPRESSION

FIELD OF THE INVENTION

The present invention relates to the field of data storage. Specifically, embodiments of the present invention relate to using data compression to improve access time to a data storage device.

BACKGROUND ART

Hard drive access time is one of the most limiting aspects of modern computing systems. Access time includes seek time, rotational latency, and command processing overhead time. Track-to-track seek time may be defined as the amount of time it takes a hard drive's read/write head to locate the disk track of a piece of data. Rotational latency may be defined as the average time for the sector being accessed to rotate into position under a head, after a completed seek. Rotational latency may be calculated from the spindle speed, being the time for half a rotation. A drive's average access time may be defined as the interval between the time a request for data is made by the system and the time the data is available from the drive.

One way to decrease data access time is to increase the rotational rate of the disk and hence decrease rotational latency. However, there are limits to how fast a drive can be made to spin without degrading performance, and thus data access time can be made only so fast by increasing spin rate. Today's hard drives are capable of amazing spin rates. For example, manufacturers have introduced drives that spin at over 10,000 rpms. However, at this spin rate tremendous heat is generated. As excessive heat will clearly degrade performance, the heat must be removed, which can complicate the design and add cost. Thus, it is desirable to improve access time without resorting to increasing the rate of disk rotation.

Another technique for improving access time is by integrating multiple devices together as in a RAID (redundant array of individual drives). In this technique a byte of data may be written and read as one bit to eight different drives. However, this substantially increases the cost of the system and is generally only appropriate for systems such as high-end servers.

A technique for increasing system capacity is data compression. However, this results in loss of performance because data become fragmented. For example, when data that are stored compressed are re-written they may not compress sufficiently to fit back into the sectors in which they were originally stored. In this case, the data become fragmented because they are stored in some random location. Hence, system performance is negatively impacted.

Therefore, it would be advantageous to provide a way to improve hard drive access time. It would also be advantageous to provide a way that does not increase the heat generated by the hard drive or require added cost or added complexity to the design to remove excess heat generated by the rotation of the disk.

SUMMARY OF THE INVENTION

Embodiments of the present invention improve hard drive access time. Embodiments of the present invention improve hard drive access time without requiring an increase to the rate of disk rotation. Embodiments of the present invention provide a way to improve hard drive access time that does not increase the heat generated by the hard drive or require ways to remove excess heat generated by the disk spinning. Embodiments of the present invention perform compression transparently to software operating on the computer system. The present invention provides these advantages and others not specifically mentioned above but described in the sections to follow.

A data storage system using compression to increase performance is disclosed. The system has a hardware compression/decompression engine for performing data compression on a data block and performing data decompression of the data block. A controller is coupled to the hardware compression/decompression engine and is for storing compressed data of the data block in a primary region of a data storage device and is further for storing any overflow from the primary region in an overflow region of the data storage device. The overflow region is dedicated to the primary region. System performance is increased as a result of data compression because less information is written to and read from the disk.

In one embodiment, there are a number of such primary regions and a number of such secondary regions, with the secondary regions mapped one-to-one to the primary regions.

Yet another embodiment is a system for performing data compression. The system has a network processor, a storage processor, and compression hardware coupled to the network processor and to the storage processor. In this fashion, the network processor and the storage processor share the compression hardware.

Still another embodiment provides for a method of memory management. The method comprises primary reading data into memory from a storage device. Then, a memory address and a disk location for the data are stored in a table to link the data in memory to the data on the storage device. In response to a request to write to a portion of the data on the storage device, the table is checked to determine whether the data in memory is copy of the data on the storage device, with the exception of the new portion. If so, the data in memory is written to the storage device. If not, the storage device is written by reading the data from the storage device into memory, overwriting the portion of the data onto the data just read into memory, and writing that data in memory to the storage device.

Another embodiment provides for a data storage device that has sectors comprising a number of bits for storing data. At least one of the sectors has an additional bit for a flag defining characteristics of data stored therein.

BRIEF DESCRIPTION OF THE DRAWINGS

The accompanying drawings, which are incorporated in and form a part of this specification, illustrate embodiments of the invention and, together with the description, serve to explain the principles of the invention.

FIG. 5 is a table for mapping main memory locations to data storage device locations to improve writes to only a portion of data, according to an embodiment of the present invention.

DETAILED DESCRIPTION OF THE INVENTION

Figure 1A:
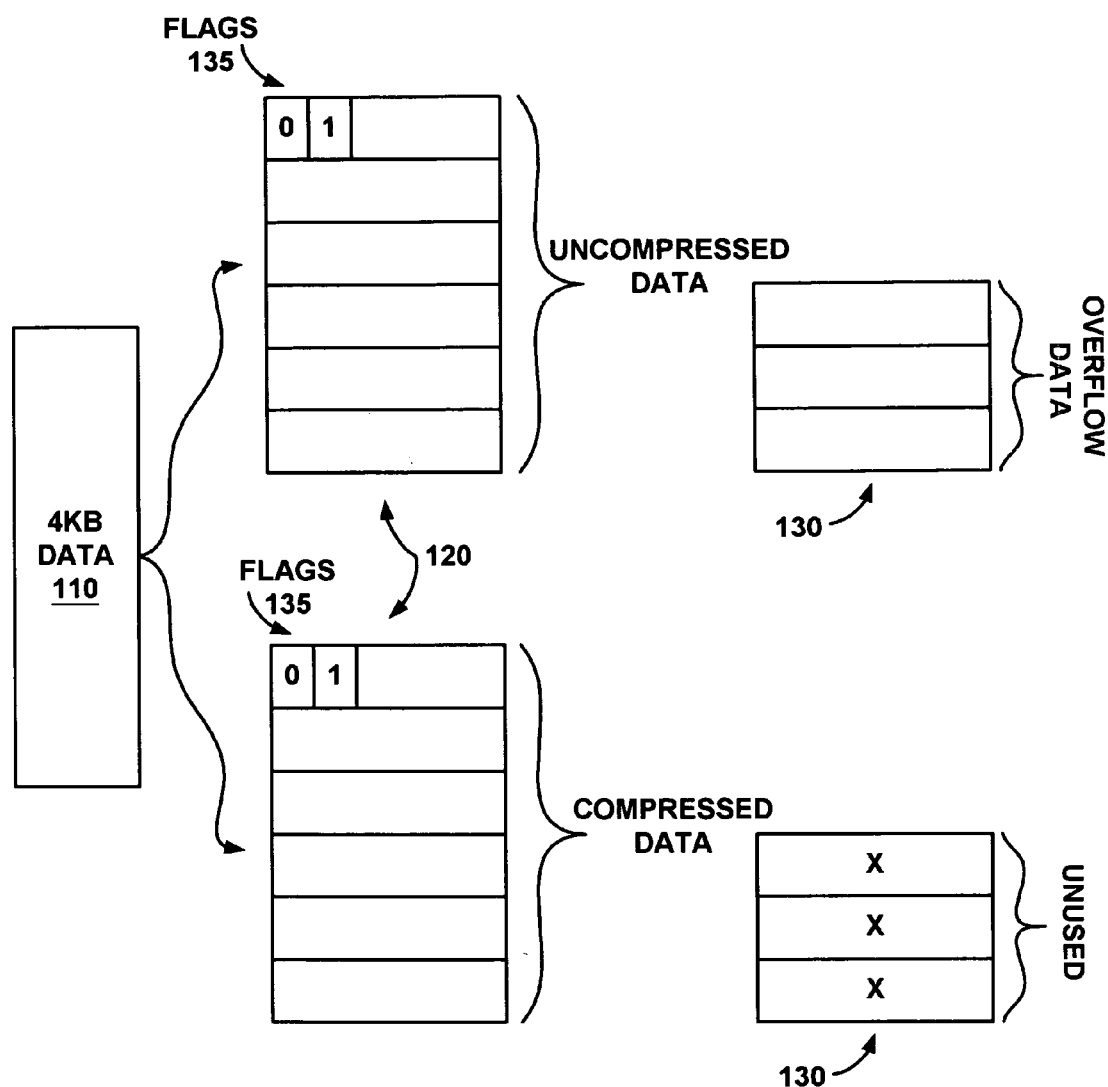
FIG. 1A is a diagram illustrating data, potentially being compressed, mapped to either a primary region or the primary and a secondary region of a data storage device, according to an embodiment of the present invention.

In the following detailed description of the present invention, a method and system for improving access time using compression, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

NOTATION AND NOMENCLATURE

Some portions of the detailed descriptions which follow are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "indexing" or "processing" or "computing" or "translating" or "calculating" or "determining" or "scrolling" or "displaying" or "recognizing" or "generating" or "storing" or "reading" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

TRANSPARENT COMPRESSION

Embodiments of the present invention decrease access time to a data storage device by compressing data before storing it in a primary region of the hard drive. A secondary region of the hard drive is for storing data that fails to compress sufficiently to fit in the primary region. There may be many such primary and secondary regions that map to one another. On read back, the data are then decompressed. The size and location of the regions are strategically established to increase performance by allowing fewer sectors to be read than if the data were stored uncompressed. In some cases, the data may be stored uncompressed (e.g., in both the primary and secondary region) and may take fractionally longer to access. However, with appropriately selected parameters, the system shows a net performance gain. A memory controller may be configured to store data to the appropriate regions of the data storage device.

Conventional compression techniques degrade access time performance compared to not compressing at all because the data become fragmented. For example, data may be stored compressed into a group of data blocks. Later, those data are modified and may not compress to fit into the original physical location. The result is that the data become fragmented on the disk with a first portion located in the original physical location and the leftover portion in a random physical location. Space may be saved, but it takes longer to access the data.

Embodiments of the present invention improve access time by strategically selecting where and in what size portions of data are stored on the hard drive. Embodiments of the present invention may potentially use more space than if all the data were stored uncompressed. The improvement gain over no compression is based on factors, such as, for example, the probability that all data blocks to be written will successfully compress to fit into the primary region, the size of the regions, and the possible added cost of accessing data that overflow into secondary regions.

FIG. 1A shows an example in which 4 KB of input data 110 are to be compressed, which may correspond to eight physical sectors of 512 byte data on the data storage device. Two examples are shown, one (top) in which the 4 KB successfully compresses to fit entirely in the primary or data region 120 and a second (bottom) in which it does not. The primary or data region 120 may comprise six sectors, five sectors may be exclusively for data and one sector may be for one or more flags 135 and data. The flags 135 may indicate whether the overflow region 130 is being used and whether the data are compressed. For example, in the top example in FIG. 1A, the flag 135 whose value is "0" may indicate that the data are not compressed and the flag 135 whose value is "1" may indicate that the secondary or overflow region 130 is being used. The overflow region 130 may comprise three sectors, all of which may store overflow data. In the lower example in FIG. 1A, the data successfully compress to fit entirely into the data region 120 and the overflow region 130 is unused.

The total number of sectors in the data and overflow regions (120, 130) may be one more than the total number of sectors required if the data were stored uncompressed. This is because one sector may contain flags 135, along with data. In the event that the input data block 110 is already compressed it may fail to compress any further and may thus require a full 4 KB on the data storage device. Because the flags 135 require at least one bit, it may be necessary to have an 'extra' sector such that the entire 4 KB input data block 110 may be stored within the data region 120 and the overflow region 130. However, the data region 120 does not always require that one sector be set aside for flags 135, as will be discussed herein. Moreover, the data region 120 and overflow region 130 may each be selected to be other sizes. Furthermore, the input data 110 to be compressed may be other than 4 KB.

Figure 1B:
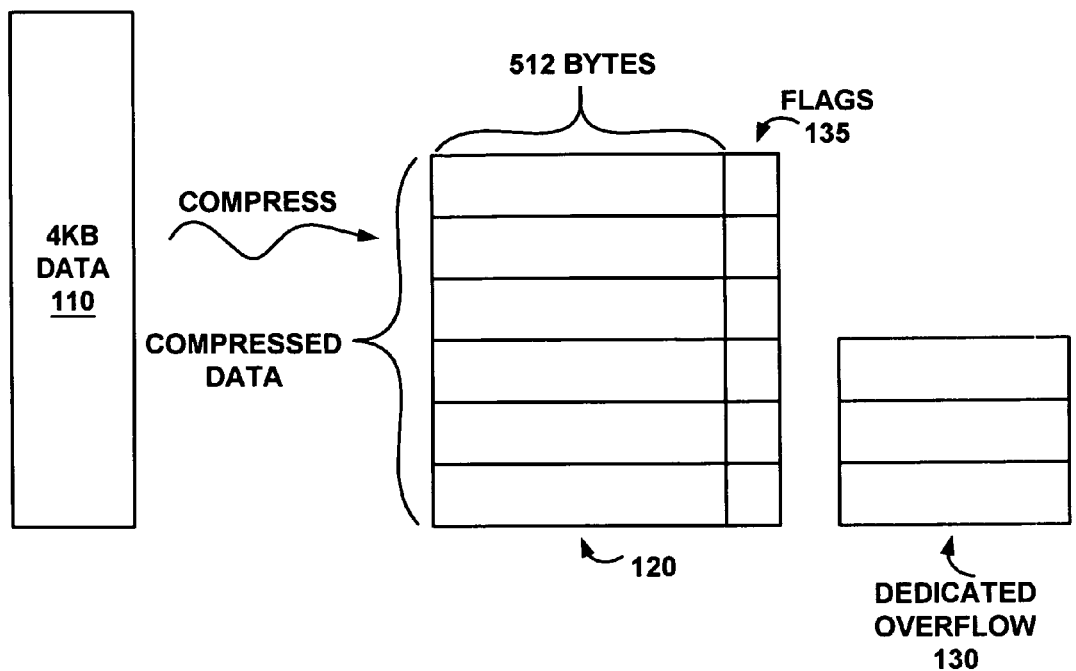
FIG. 1B is a diagram illustrating sectors of a data storage device having flags for indicating characteristics of data in the sectors, according to an embodiment of the present invention.

In the embodiment illustrated in FIG. 1B, at least one data sector has one or more bits set aside for flags 135 for indicating characteristics of data in the sectors. Each of the sectors may have, for example, 512 bytes to be used for data and an additional bit or bits to be used for a flag or flags 135. The flags 135 may be read or written as part of a normal read or write operation. Thus, for example, a memory controller may issue a single read command with an option to read the flag and the data. The data storage device responds by reading the flags 135 along with the data and sends back both the flags 135 and data as part of the same operation. The memory controller may also issue a read or write to access only data and not the flags 135. The flags 135 may indicate whether the data stored in that sector or a group of sectors is compressed. Flags 135 may also define whether a dedicated overflow region 130 stores data or is unused. Thus, one embodiment of the present invention is a data storage device having a number of sectors each with a number of bits for storing data. At least one of the sectors has an additional bit for a flag 135 defining characteristics of data stored therein.

Figure 2A:
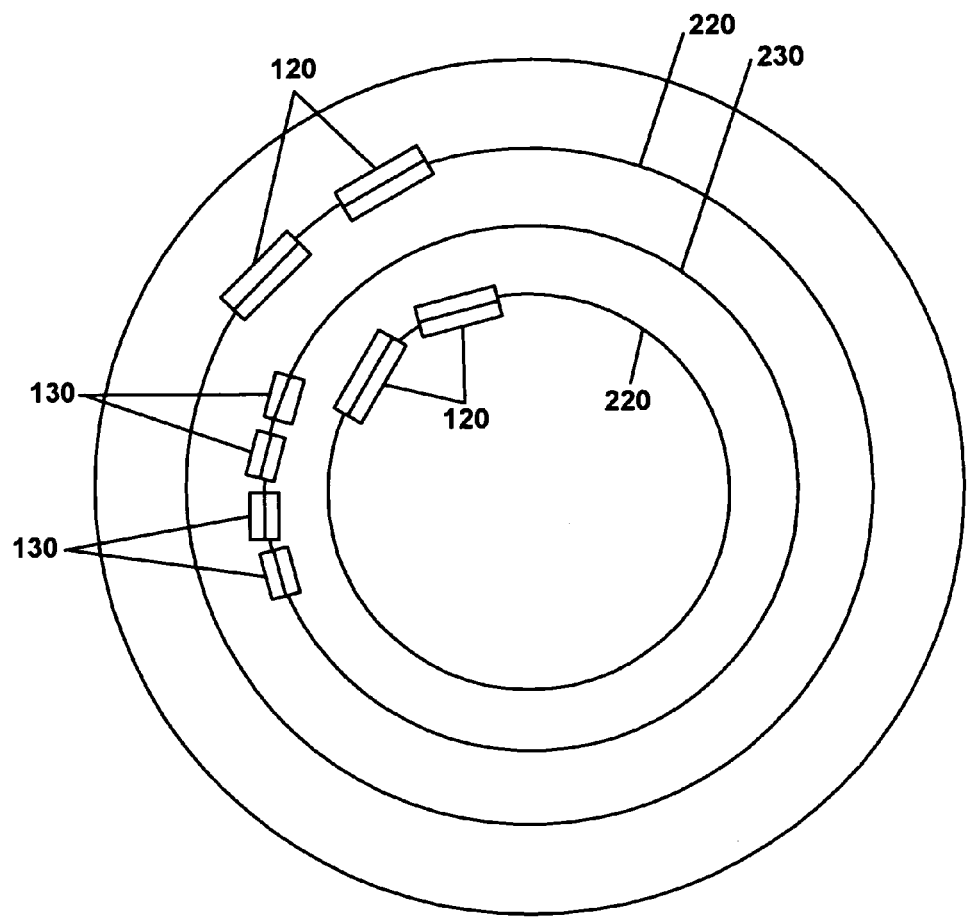
FIG. 2A is a diagram of a disk surface of data storage device divided into different regions for improving disk access time, according to an embodiment of the present invention.

Referring now to FIG. 2A, a surface of a disk 210 of a data storage device is divided into primary or data regions 120 that are for storing data that compresses sufficiently to fit entirely within the data region 120. If the data do not compress sufficiently to fit entirely in a data region 120, only a portion may be stored in the data region 120. Secondary or overflow regions 130 of the data storage device may be for storing overflow data (e.g., a portion of the data that does not compress sufficiently to fit in the data region 120). When using both a data region 120 and an overflow region 130, the data may generally be stored uncompressed. However, this is not required, and all or portion of the data may be compressed in this case.

Still referring to FIG. 2A, the data storage device may have data tracks 220 that are dedicated for data regions 120. The data storage device may also have one or more overflow tracks 230 for overflow regions 130. It may be that there are two data tracks 220 for every one overflow track 230, although this is not required. Furthermore, it is not required that an entire track be dedicated to either data or overflow. In one embodiment, each data region 120 may be mapped to one overflow region 130. A data region 120 may comprise contiguous sectors on a data track 220. This may map to a dedicated overflow region 130 on an adjacent or nearby track, which keeps the track-to-track seek time low in the event the overflow track 230 must be read.

Furthermore, the dedicated overflow region 130 may be located at a skew such that it may be read (with high probability) by moving the head to the adjacent overflow track 230 after reading pertinent data regions 120 on the data track 220 on the same disk rotation. The skew may depend on how many data regions 120 are typically read, the expected maximum number of data regions 120 that are read, etc. For example, 64 KB of uncompressed data may compress to twelve 4 KB data regions 120 and possibly one or more overflow regions 130. The skew may be such that a request to read this amount of data will access data on both the data track 220 and overflow track 230 in one or less disk revolutions. Thus, embodiments base the skew on track-to-track seek time and the size of data involved in disk accesses, as well as the rotational rate of the disk.

Figure 2B:
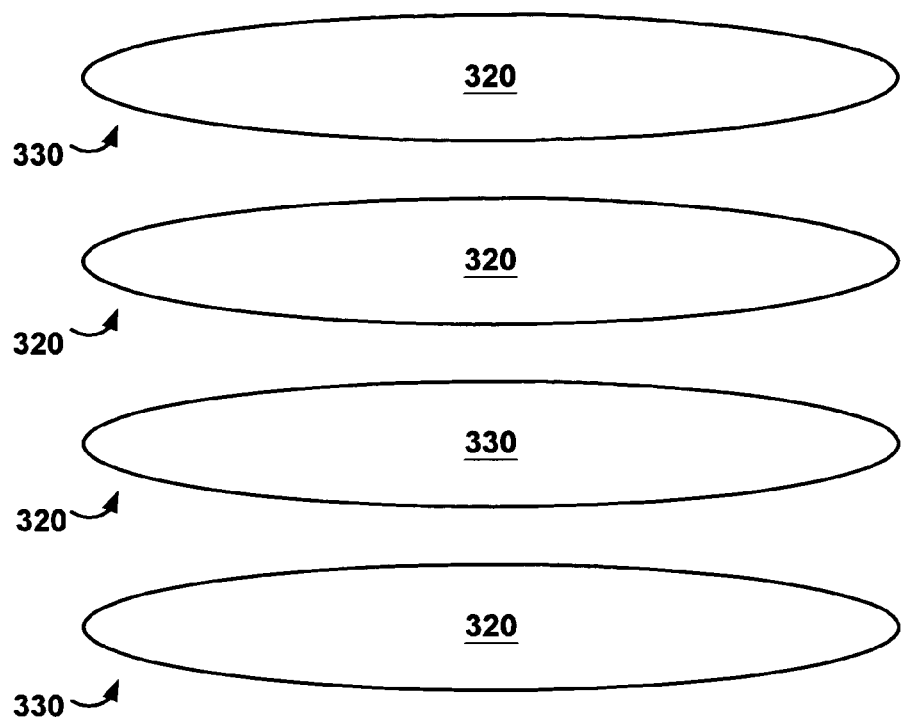
FIG. 2B is a diagram of disks of a data storage device divided into different regions for improving disk access time, according to an embodiment of the present invention.

Referring now to the embodiment of FIG. 2B, some disk surfaces 210 may be dedicated to data (e.g., data surfaces 320) and others may be dedicated to overflow (e.g., overflow surfaces 330). For example, five of the surfaces (or portions thereof) may be dedicated to data regions 120, while three of the disk surfaces (or portions thereof) may be dedicated to overflow regions 130. Thus, there may be a data region 120 on the topmost disk with a corresponding overflow region 130 in the bottom surface of that disk or on some other disk surface 210. In this fashion, the overflow region 130 may be on the corresponding track of a different disk surface 210 than the data region 120 (e.g., the same cylinder). Thus, there is no need for track-to-track movement of the head(s).

Figure 3:
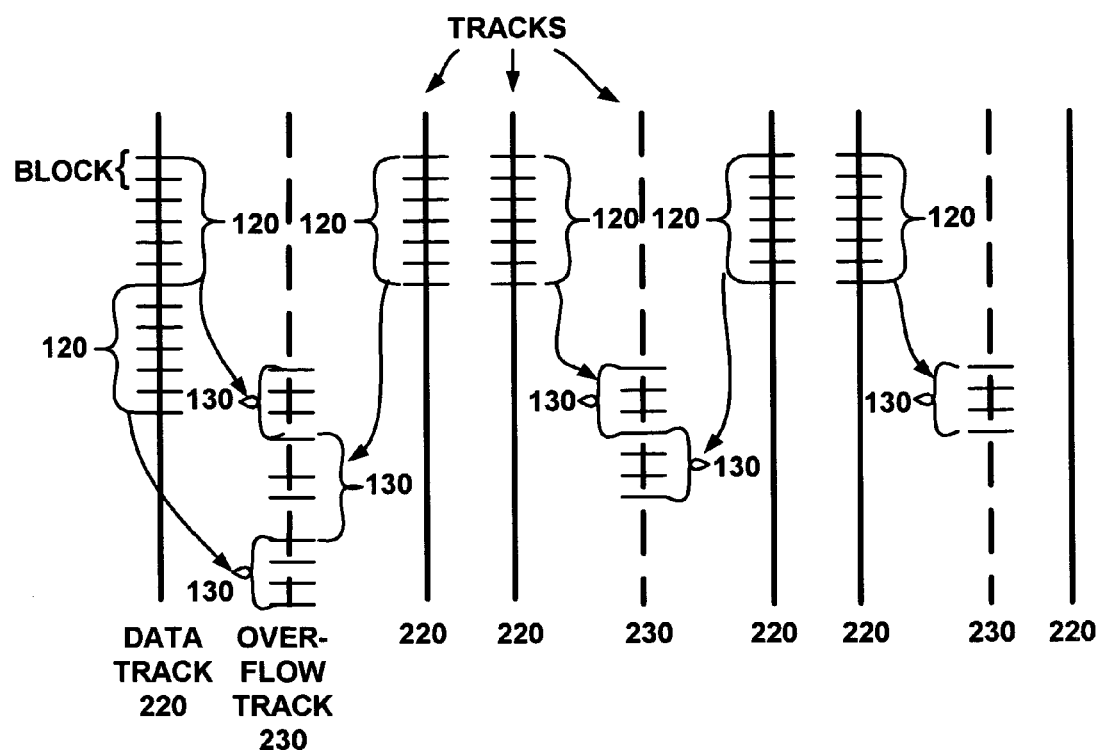
FIG. 3 illustrates tracks of a data storage device having regions for a first class of data and associated regions for storing a second class of data, according to an embodiment of the present invention.

Referring now to FIG. 3, embodiments of the present invention may be understood by examining how data may be stored in several adjacent tracks of a data storage device. The tracks may be arranged in groups of three with two of the three tracks being for data and the third for overflow. The data regions 120 in a data track 220 may store data that successfully compress to fit within the sectors, and also a portion of the data which does not successfully compress. Each group of data sectors (e.g., data region 120) may map to a group of overflow sectors (e.g., overflow region 130). The ratio between the size of data regions 120 and overflow region 130 may be fixed. For example, there are three overflow sectors for six data sectors. The mapping may be done ahead of time. Thus, no pointers are needed. If a 'data' region 120 is re-written and needs to use an overflow region 130, no changes need to be done to the mapping. The present invention is not limited to a ratio of two data tracks 220 to one overflow track 230.

As discussed herein, an (uncompressed) portion of data (e.g., page, cluster, etc.) is compressed and stored on a data storage device in either only a data region 120 or the data region 120 and an overflow region 130. The data region 120 is smaller than the uncompressed data. The size of the data region 120 is selected such that the probability is low that the overflow region 130 will be needed. By not having to access the overflow region 130, the data may be read more efficiently. It may also be written faster.

While an example of a six sector data regions 120 and three sector overflow regions 130 is given, the sizes of these regions (120, 130) may be selected to optimize access time. The optimization may involve selecting a compression algorithm and data region 120 size, such that there is a high probability that data will compress sufficiently to fit into the data region 120. High probability may mean sufficiently high to improve access time. Some of the factors involved in this determination are the improvement in access time when the data successfully compress (and only the data region 120 needs to be accessed) and the decrease in performance that occurs when accessing the overflow region 130.

Embodiments of the present invention improve access time by better than 10%, as illustrated by the following analysis. The following assumes 64 KB disk pre-fetches, a disk transfer rate of 24 MB/s for the inner diameter and 44 MB/s for the outer diameter of the disk. Therefore, reading 64 KB on the inner diameter will take 2.66 ms and reading 64 KB on the outer diameter will take 1.45 ms, for an average of about 2.06 ms.

If all of the data compress to fit in data regions 120 and the compression ratio is 8:5, then the access time will be, on average, 2.06 ms*(5/8)=1.29 ms. Thus, on average 0.77 ms are saved versus no compression. Without the present invention, average latency may be 4.2 ms+2.06 ms=6.26 ms. Embodiments of the present invention may have an average latency of 4.2 ms+1.29 ms=5.49 ms, which is a 14% improvement, on average. However, sometimes all of the data will not successfully compress to fit entirely into data regions 120. In those cases, one or more overflow regions 130 need to be accessed. However, the amount of overhead to access these regions 130 is kept low by their proximity to the data regions 120. Table 1 provides exemplary improvements that may be achieved versus the percent of time that the input data 110 successfully compress to fit entirely into the data region(s) 120 for a case in which there are five sectors in the primary or data region 120 and four sectors in the secondary or overflow region 130.

TABLE 1

| Compressed I/O % | Average Access Time | Performance Gain (%) |
| --- | --- | --- |
| 100 | 5.49 | 14.0 |
| 99 | 5.52 | 13.5 |
| 98 | 5.54 | 13.0 |
| 97 | 5.57 | 12.4 |
| 96 | 5.59 | 11.9 |
| 95 | 5.62 | 11.4 |
| 94 | 5.65 | 10.9 |
| 93 | 5.67 | 10.4 |
| 92 | 5.70 | 9.9 |
| 91 | 5.72 | 9.4 |
| 90 | 5.75 | 8.9 |
| 89 | 5.78 | 8.4 |
| 88 | 5.80 | 7.9 |
| 87 | 5.83 | 7.4 |
| 86 | 5.85 | 6.9 |
| 85 | 5.88 | 6.5 |
| 84 | 5.91 | 6.0 |
| 83 | 5.93 | 5.5 |
| 82 | 5.96 | 5.1 |
| 81 | 5.98 | 4.6 |
| 80 | 6.01 | 4.2 |
| 79 | 6.04 | 3.7 |
| 78 | 6.06 | 3.3 |
| 77 | 6.09 | 2.8 |
| 76 | 6.11 | 2.4 |
| 75 | 6.14 | 2.0 |
| 74 | 6.17 | 1.5 |
| 73 | 6.19 | 1.1 |
| 72 | 6.22 | 0.7 |
| 71 | 6.24 | 0.3 |
| 70 | 6.27 | −0.2 |

The present invention is well suited to other combinations of the number of sectors in the data region 120 and number of sectors in the overflow region 130. If a different compression ratio is desired (e.g., a different ratio of the input data 110 to the data region 120), then the average access time may be affected.

The input data block 110 size may affect the compression ratio. Therefore, the size that may be suitable for the data region 120 may depend on the size of input data 110. For example, the ratio of the data region 120 to the input block size 110 may be adapted to suit the expected compression ratio for a given input block size 110. With many compression algorithms, the larger the data to be compressed the better the compression ratio. Exemplary compression ratios using a three byte hash with static Huffman compression tree are provided in Table 2. The compression ratio may also depend on the nature of the input data 110.

TABLE 2

| Input Block Size | Compression Ratio | Saved Space |
| --- | --- | --- |
| 1 KB | 68% | 32% |
| 2 KB | 63% | 37% |
| 4 KB | 59% | 41% |
| 8 KB | 55% | 45% |
| 16 KB | 53% | 47% |
| 32 KB | 51% | 49% |

An example has been presented herein with a 4 KB input data block 110 (e.g., a memory page may be 4 KB, although the present invention is not limited to 4 KB memory pages) and a 3 KB data region 120 (with perhaps just under 3 KB for data and a small portion for flags 135) for a compression ratio of approximately 6/8. However, if the input data block 110 is typically 32 KB, then the ratio of the data region 120 to the input data block 110 may be lower, as a better compression ratio is expected.

The compression ratio may also depend on the data compression algorithm. For example, for a 16 KB data block, the compression ratio may vary from 36% to 61% (or even a wider range) depending on the algorithm used. Algorithms that compress more effectively may be more computationally intensive. In order to optimize performance, a suitable compression algorithm may be selected. In turn, the size of the data regions 120 may be selected such that a suitable percentage of the input data blocks 110 compress. In this fashion, data storage device access time is improved.

Figure 4:
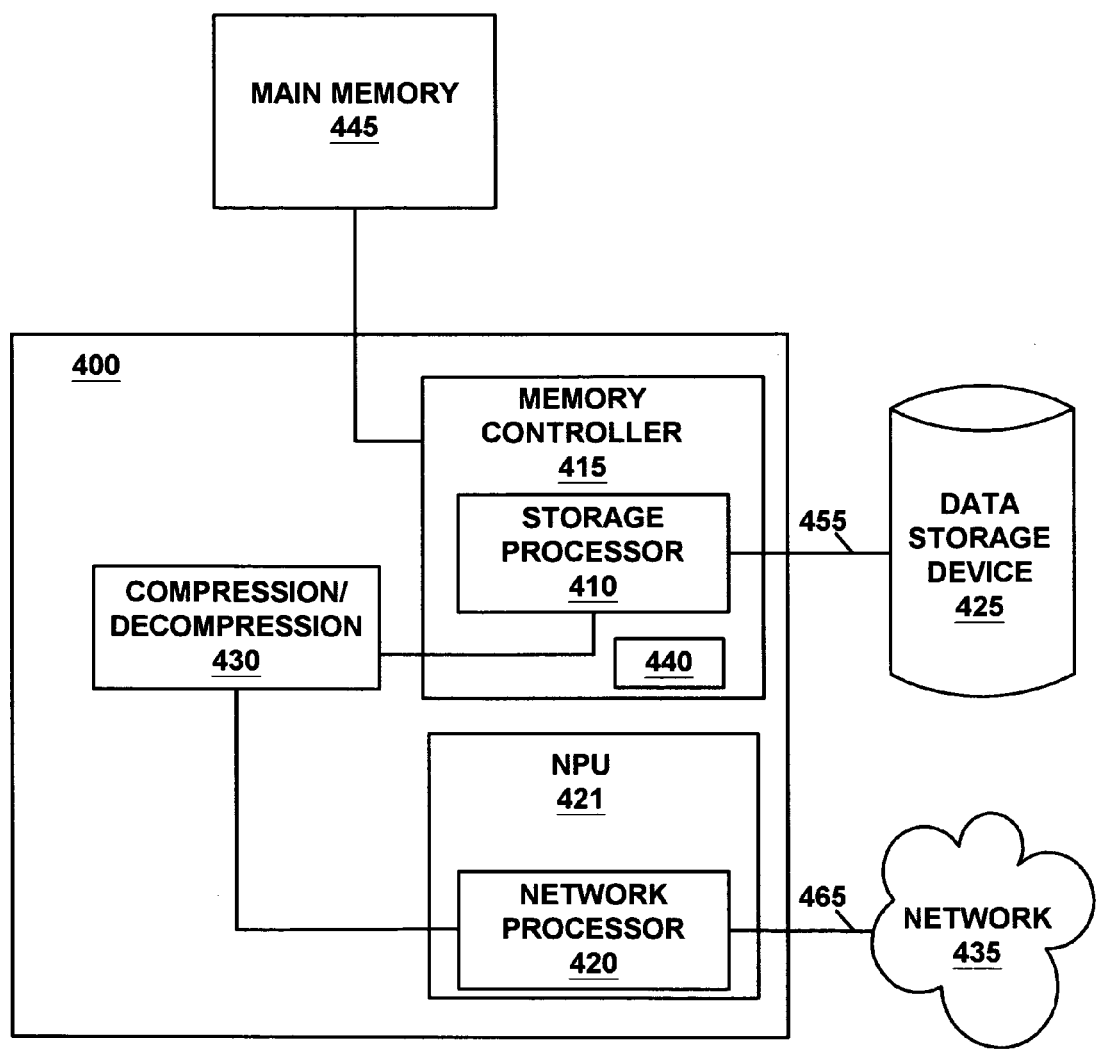
FIG. 4 is a block diagram illustrating hardware for decreasing disk access time, according to an embodiment of the present invention.

FIG. 4 illustrates an embodiment of a system for improving data access time, which may use selected hardware for dual-purposes. The system has input/output card 400 having a memory controller 415 for controlling a data storage device 425. The memory controller 415 has an interface 455 to the data storage device 425 and a storage processor 410. The input/output card 400 also has a network processor unit (NPU) 421 for interfacing to a network 435 via network interface 465 and having a network processor 420. A compression/ decompression engine 430 may be shared between the storage processor 410 and the network processor 420, although this is not required. The memory controller 415 itself may contain a compression/decompression engine 430 or it may interface to the compression/decompression engine 430. The memory controller 415 may also have a table 440 to facilitate avoiding having to read in compressed data from the data storage device 425 when only a portion of that data is to be modified. As described below, this method may involve keeping track of what has been read from the data storage device 425 to main memory 445.

In some cases, the input data 110 consist of less than the full size of a data region 120. For example, the data region 120 (and associated overflow region 130) may be for storing 4 KB of uncompressed data. However, the memory controller 415 may receive a request to update only a portion of that data. For example, often master file table (MFT) updates are performed as 1 KB (e.g., two sectors) writes to the data storage device 425. Because the data may well be stored as a compressed page (e.g., 4 KB) on the data storage device 425, simply writing two sectors cannot be done. One way to perform a re-write involving only a portion of compressed data is to read in the compressed data, de-compress it, add in the new (portion) of data, re-compress the data (if possible), and write the entire data to the data storage device 425.

Figure 5:
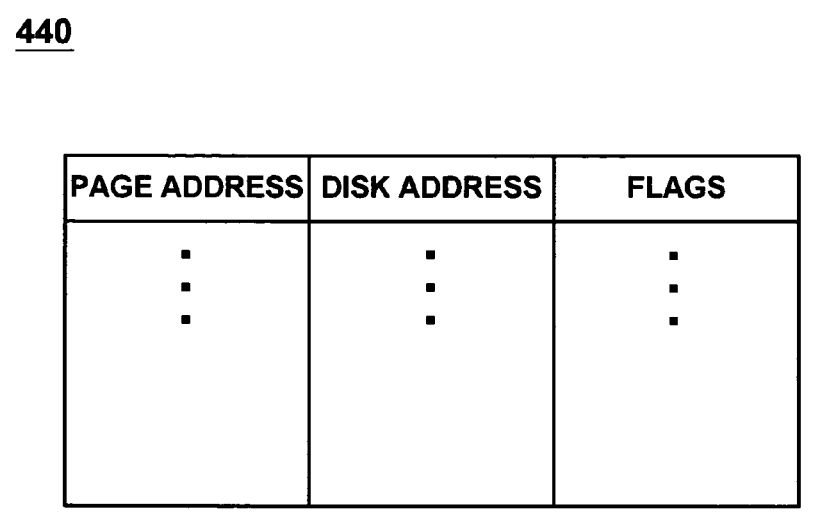

However, an embodiment of the present invention provides for a method that avoids read-modify-write for such updates. In this case, the memory controller 415 monitors memory accesses (e.g., data read from the data storage device 425 to main memory 445) and stores information in the table 440 regarding what sectors were read. When an MFT record (e.g., two sectors) is to be written, the memory controller 415 determines if it has a pointer to a true copy of what is on the data storage device 425, or at least a true copy save the 1 KB to be modified by the write. If so, the memory controller 415 accesses the data from main memory 445 and compresses it (if possible) and writes the (compressed) 4 KB to the data storage device 425. Referring to FIG. 5, the table 440 may comprise a number of pairs of page locations and data storage device 425 locations. These pairs may correspond to data regions 120. The table 440 may be implemented within a translation look aside buffer (TLB). In one embodiment, the table 440 may comprise a number of flags that keep track of modifications to portions of data within the data region 120.

Figure 6:
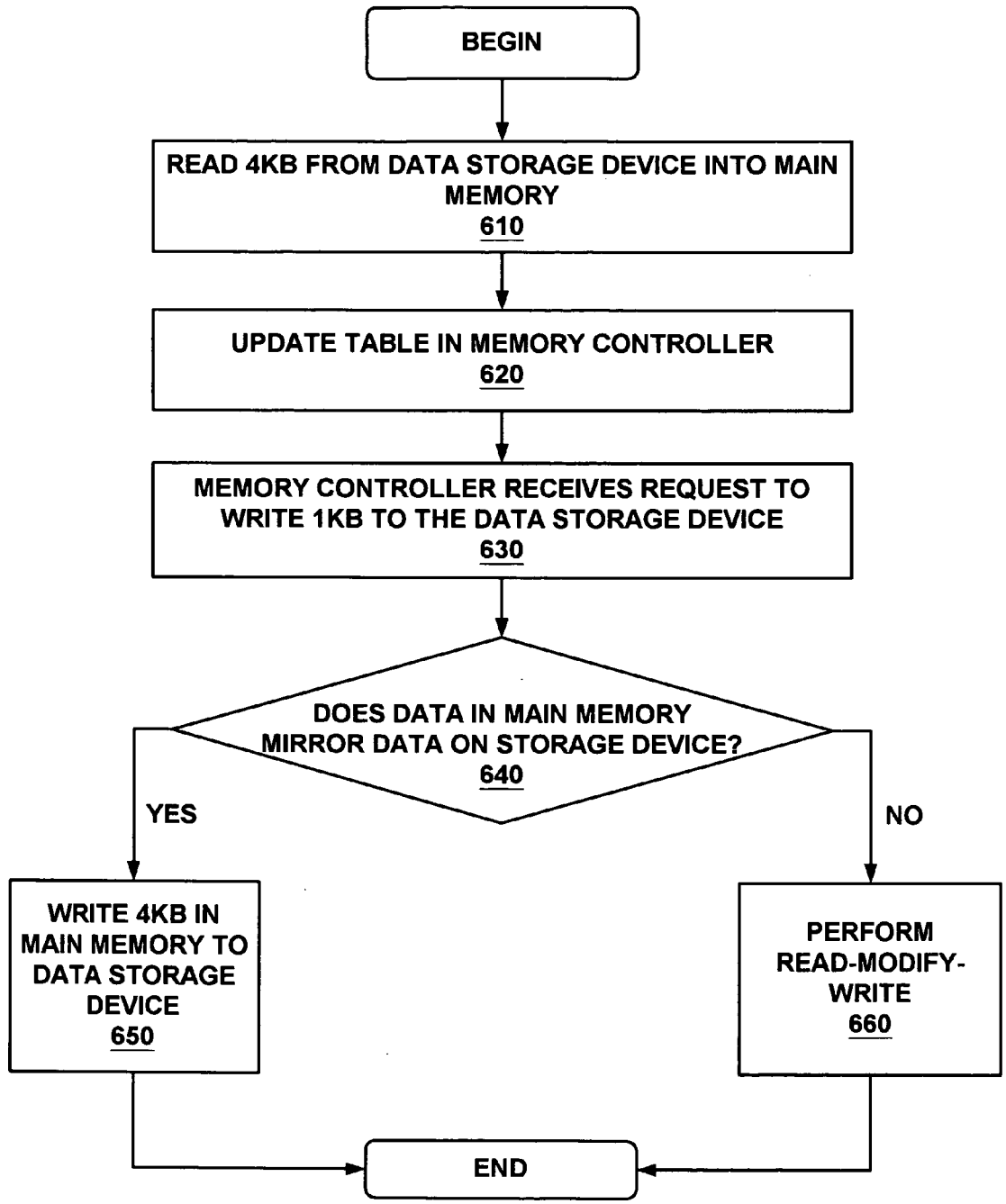
FIG. 6 is a flowchart illustrating steps of a process of updating a portion of data to a data storage device, according to an embodiment of the present invention.

Referring now to FIG. 6, an embodiment provides for a method of improving data storage device 425 access time by using data compression. The particular example involves the data on the data storage device (e.g., the data region alone 120 or the data region 120 and the overflow region 130) corresponding to 4 KB input data blocks 110 and the update to a portion of that data on the data storage device being 1 KB of input data, although other sizes may be used for either parameter. Steps of process 600 may be stored as instructions on a computer readable medium and executed on a computer processor. Process 600 of FIG. 6 begins with, for example, the operating system reading in 4 KB of data from a data storage device 425 location, in step 610. The memory controller 415 may execute a direct memory access in response to this request.

In step 620, the memory controller 415 updates the table 440 by adding an entry for the data storage device 425 data location and the page address in main memory 445 to which the data were read.

The operating system will then likely perform a number of other operations; however, the data may remain in main memory 445 unchanged. At some later point in time, the operating system makes a request to write 1 KB of data to the data storage device 425, in step 630. The operating system updates that 1 KB in main memory 445, while providing the page address (and perhaps an offset) for that 1 KB.

In step 640, the memory controller 415 checks the table 440 to determine if it has a valid pointer to the entire 4 KB, such that it may avoid performing a read-modify-write. The memory controller 415 may check to see if it has a matching page address for the data to be written, factoring in that only 1 KB somewhere in the 4 KB is to be written. The memory controller 415 may also determine whether the disk location in the table 440 matches that for the write, again factoring in that only 1 KB somewhere in the 4 KB is to be written. Step 640 may optionally include the memory controller 415 consulting flags in the table 440 to determine if the data in main memory 445 may still be trusted. For example, the flags (these are not the flags 135 in the data region 120) in the table 440 may be used to indicate that a portion of the data has been previously updated.

If the determination in step 640 is positive, then the memory controller 415 simply compresses the 4 KB in main memory (if possible) and writes the whole page to the data storage device 425, in step 650. At this time, the memory controller 415 may also set a flag in the table 440 to indicate that this 1 KB portion of the 4 KB page was modified.

However, if the determination in step 640 is negative (e.g., the memory controller 415 determined that the data in main memory 445 is not trusted), then it performs a read-modify-write in step 660. This may involve reading the entire 4 KB from the data storage device 425 whether it is stored in the overflow region 130 or not. If necessary, the data are decompressed. Then, the 1 KB of data are inserted where appropriate. Then, the memory controller 415 compresses the data, if possible. Finally, the data are re-written to the data storage device 425. Even if the data were originally compressed and stored only in the data region 120 and now requires the overflow region 130, no portion of the data storage device 425 needs to be written that was not either written to before or reserved for overflow. For example, an overflow region 130 may always be associated with a data region 120 even if it is not needed upon the first write to the data storage device 425.

Rather then storing flags 135 on the data storage device 425, an embodiment of the present invention stores flags in the memory controller 415 that describe how data are stored on the data storage device 425. The memory controller 415 may have a table (e.g., a portion of table 440) that keeps track of data regions 120 written to and whether associated overflow regions 130 are used. When a request is received to read the data storage device 425, the memory controller 415 may check the table to determine ahead of time if it will need to access the overflow region 130 or only the data region 120.

Figure 7:
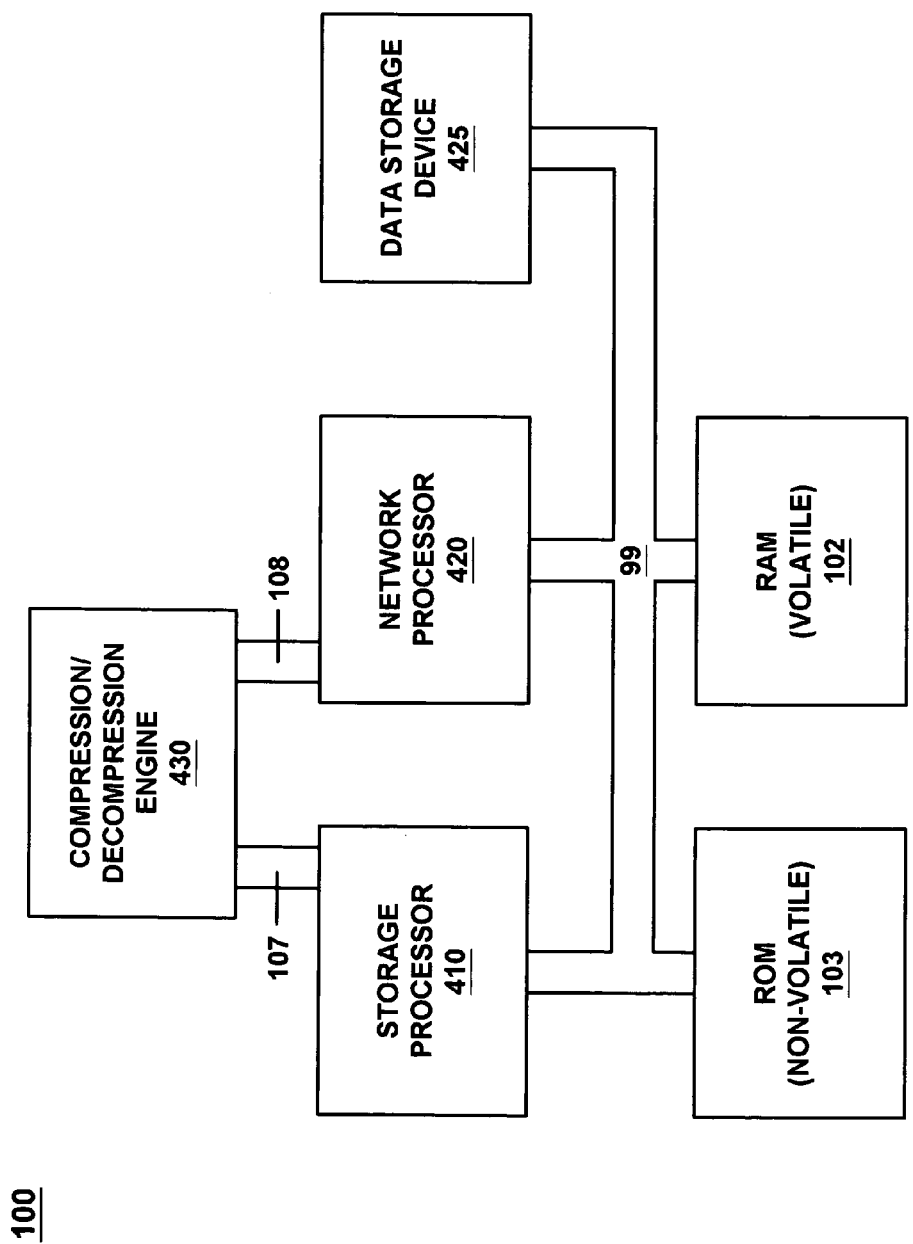
FIG. 7 is a schematic of a computer system, which may be used to implement embodiments of the present invention.

FIG. 7 illustrates circuitry of computer system 100, which may form a platform for embodiments of the present invention. For example, portions of the network processor unit 421 and the memory controller 415 may be implemented by computer system 100, or a portion thereof. Computer system 100 includes an address/data bus 99 for communicating information, a storage processor 410 and a network processor 420 coupled with the bus 99 for processing information and instructions, a volatile memory 102 (e.g., random access memory RAM) coupled with the bus 99 for storing information and instructions for either the storage processor 410 or the network processor 420 and a non-volatile memory 103 (e.g., read only memory ROM) coupled with the bus 99 for storing static information and instructions for either the storage processor 410 or the network processor 420. Computer system 100 also includes a data storage device 425 (e.g., a magnetic or optical disk and disk drive) coupled with the bus 99 for storing information and instructions. Furthermore, the system 100 includes a compression/decompression engine 430, which is shared by the storage processor 410 and the network processor 420 via busses 107, 108.

The preferred embodiment of the present invention, a method and system for improving access time using compression, is thus described. While the present invention has been described in particular embodiments, it should be appreciated that the present invention should not be construed as limited by such embodiments, but rather construed according to the below claims. In the claims, the order of elements does not imply any particular order of operations, steps, or the like, unless a particular elements makes specific reference to another element as becoming before or after. In the claims, element indicators (e.g., "a)", "b)", etc.) do not indicate any particular ordering of the elements.

What is claimed is:

1. A data storage system using compression to increase performance, said data storage system comprising:
   a hardware compression/decompression engine for performing data compression on a data block and performing data decompression of said data block; and
   a controller coupled to said hardware compression/decompression engine and for storing compressed data of said data block in a primary region within a first track of a data storage device and for storing any overflow from said primary region in an overflow region within a second track of said data storage device, wherein said overflow region is dedicated to said primary region.

2. The data storage system of claim 1, wherein said data block is received from an operating system, and said performing data compression is done in a manner transparent to said operating system.

3. The data storage system of claim 1, wherein:
   said primary region comprises a first plurality of sectors;
   said overflow region comprises a second plurality of sectors; and
   wherein a fixed ratio exists between the number of sectors in said primary region and the number of sectors in said overflow region.

4. The data storage system of claim 1, wherein said first track is adjacent to said second track.

5. The data storage system of claim 1, wherein:
   said primary region is within a first surface of said data storage device and said overflow region is within a second surface of said data storage device.

6. The data storage system of claim 1, wherein:
   said controller is further for storing said compressed data in one of a plurality of said primary regions of said data storage device and for storing any overflow from said one of a plurality of primary regions in one of a plurality of said overflow regions of said data storage device, wherein said controller comprises a mapping function maintaining a one-to-one mapping between each primary region and each overflow region.

7. The data storage system of claim 6, wherein said mapping is one-to-one.

8. The data storage system of claim 6, wherein said mapping is two-to-one.

9. The data storage system of claim 6, wherein said mapping function uses a table.

10. The data storage system of claim 6, wherein each primary region comprises a first flag bit indicating whether or not its associated overflow region is being used to store data.

11. The data storage system of claim 6, wherein each primary region further comprises a second flag bit indicating whether or not said primary region contains compressed data.

12. The data storage system of claim 1, wherein said data storage device comprises a disk and further wherein a skew between said primary region and said overflow region is based on disk rotation speed and track-to-track seek time.

13. The data storage system of claim 12, wherein said skew is further based on an expected size of accesses to said data storage device.

14. The data storage system of claim 1, wherein the size of said primary region is selected to accommodate a majority of compressed data blocks within said primary region.

15. The data storage system of claim 1, wherein said primary region is smaller than if said data block were stored uncompressed and further wherein said compressed data in said primary region are accessible more efficiently than if stored uncompressed.

16. The data storage system of claim 1, wherein the sum of the size of said primary region and said overflow region is greater than if said data block were stored uncompressed.

17. The data storage system of claim 1, wherein the size of said primary region is selected to optimize performance in accessing said primary region.

18. The data storage system of claim 17, where said optimization is based on:
   the probability that said data block compresses to fit entirely within said primary region; and
   data access time to said primary region.

19. A data storage system using compression to increase performance, said data storage system comprising:
   a hardware compression/decompression unit for performing data compression on a memory page and performing data decompression of said memory page;
   a data storage unit comprising a disk comprising a first region of sectors and a second region of sectors; and
   a controller for storing compressed data of said memory page in a primary sector group of said first region and for storing any overflow from said primary region in an overflow sector group of said second region, wherein said primary sector group of said first region is mapped to said overflow sector group of said second region prior to determination that a portion of said memory page is to be stored as said overflow from said primary sector group in said overflow sector group.

20. The data storage system of claim 19, wherein said memory page is received from an operating system, and said performing data compression is done in a manner transparent to said operating system.

21. The data storage system of claim 19, wherein said second region of sectors is dedicated for storing said overflow.

22. The data storage system of claim 19, wherein a fixed ratio exists between the number of sectors of said primary sector group of said first region and the number of sectors of said overflow sector group of said second region.

23. The data storage system of claim 19, wherein:
   said first region is within a first track of said disk and wherein said second region is within a second track of said disk.

24. The data storage system of claim 23, wherein said first track is adjacent to said second track.

25. The data storage system of claim 19, wherein:
   said first region comprises a plurality of said primary sector groups and wherein said second region comprises a plurality of said overflow sector groups and further comprising a mapping function maintaining said mapping between each primary sector group of said first region and each overflow sector group of said second region.

26. The data storage system of claim 25, each primary sector group comprises a first flag bit indicating whether or not its associated overflow sector group is being used to store data.

27. The data storage system of claim 25, wherein each primary sector group further comprises a second flag bit indicating whether or not said primary sector group contains compressed data.

28. A storage system, comprising:
a data storage device comprising:
- a first region for storing data compressed if said data compress sufficiently to fit entirely within said first region and for storing a first portion of said data if said data do not compress sufficiently to fit entirely in said first region; and
- a second region for storing a second portion of said data if said data do not compress sufficiently to fit entirely in said first region; and a controller coupled to said data storage device and for storing information indicating whether said data stored in said first region failed to compress sufficiently to fit entirely within said first region and have said second portion stored in said second region.

29. The storage system of claim 28, wherein said storage device is a disk drive.

30. The storage system of claim 28, wherein said data storage device comprises a plurality of said first regions and a plurality of said second regions.

31. The storage system of claim 28, wherein said first region comprises a plurality of sectors.

32. The storage system of claim 31, wherein said second region comprises a plurality of sectors.

33. The storage system of claim 32, wherein said second portion of said data is stored uncompressed.

34. A system for performing data compression, comprising:
- a network processor;
- a storage processor;
- compression hardware coupled to said network processor and to said storage processor, wherein said network processor and said storage processor share said compression hardware; and
- a data storage device coupled to said storage processor and comprising:
  - a primary region for storing data compressed if said data compress sufficiently to fit entirely within said primary region and for storing a first portion of said data if said data do not compress sufficiently to fit entirely in said primary region;
  - an overflow region for storing a remaining portion of said data if said data do not compress sufficiently to fit entirely in said primary region.

35. The system of claim 34, further comprising:
a controller coupled to said data storage device and for storing information describing whether said data stored in said primary region failed to compress sufficiently to fit entirely within said primary region and has said remaining portion stored in said overflow region.

36. The system of claim 34, wherein said storage device is a disk drive.

37. The system of claim 35, wherein said controller comprises a table comprising:
- memory locations on said data storage device that have been read; and
- pointers to copies of data in main memory for said memory locations.

* * * * *